Sept. 12, 1967 C. A. NANNEY 3,341,784
ACOUSTIC WAVE AMPLIFIER
Filed March 21, 1966

INVENTOR
C. A. NANNEY
BY David P. Kelley
ATTORNEY

United States Patent Office 3,341,784

Patented Sept. 12, 1967

3,341,784

ACOUSTIC WAVE AMPLIFIER

Cecil A. Nanney, Murray Hill, N.J., assignor to Bell Telephone Laboratories, Incorporated, New York, N.Y., a corporation of New York Filed Mar. 21, 1966, Ser. No. 536,051

3 Claims. (Cl. 330—5)

Figure 1:
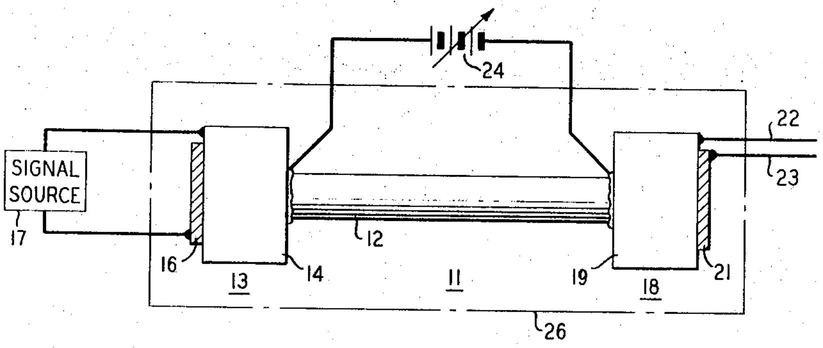

This invention relates to acoustic wave amplifiers, and, more particularly, to such amplifiers utilizing crystalline materials.

Crystal acoustic wave amplifiers can be placed in either one of two classes, those in which the crystal is piezoelectric and those in which the crystal is non-piezoelectric. In general, piezoelectric acoustic amplifiers are limited both as to the amount of gain available and as to the frequency of operation. Such devices do not function well as amplifiers of the higher microwave frequencies, such as, for example, $10^{10}$ c.p.s. (X-band). In virtually all piezoelectric devices, a phenomenon known as carrier trapping tends to limit gain necessitating cascading a number of amplifiers where high gain is desired. In piezoelectric material such as cadmium sulfide, unusually high voltages are necessary to achieve worthwhile amplification.

In non-piezoelectric devices gain is also limited by the phenomenon of hot electrons. The hot electron effects can be reduced to some extent by operating the device on a pulse basis, as with germanium, or by use of a magnetic field where the crystal is magneto-resistive, as with bismuth. Even with these expedients, however, gain is still limited.

The acoustic amplifier of the present invention is a high gain, high frequency device that can be operated on a continuous basis and does not require accessory equipment such as magnetic field producing means or the like for satisfactory operation.

The present invention is based upon the discovery that certain of the lead salts, in particular, lead telluride (PbTe) have certain unusual properties which allow them to function extremely well as high gain, high frequency acoustic amplifiers. These materials have a very large carrier concentration, high carrier mobility, and low magneto-resistance, all of which, as will be discussed hereinafter, contribute to their ability to amplify high-frequency acoustic waves.

In an illustrative embodiment of the present invention, a bar of PbTe has a pair of electrodes at the ends which are connected to a variable voltage source. Application of a voltage to the electrodes produces a carrier, that is, electron, drift along the length of the bar. As the voltage is increased, the velocity of the carriers increases. Also located at each end of the bar is a transducer, an input transducer for converting electrical signals to acoustic waves within the bar, and an output transducer for converting acoustic waves to electrical output signals. The input transducer is connected to a source of signals to be amplified, while the output transducer is connected to any suitable load.

In operation, an electrical signal is applied to the input transducer which converts it to an acoustic wave which propagates through the bar. A voltage is applied along the length of the bar and is increased until the carriers have reached a velocity sufficient to cause the carriers to give energy to the acoustic wave, thereby amplifying it. The output transducer converts the amplified acoustic wave into an output electrical signal. As will be more apparent hereinafter, the device can be made to amplify acoustic shear waves only, acoustic longitudinal waves, or to produce second harmonic generation and amplification, depending upon the amount of voltage applied. The material has an unusual characteristic in that for certain drift velocities, the electrons give up energy to the shear wave, at other velocities to the second harmonic of the acoustic wave, and at still other velocities, to the longitudinal wave.

It is a feature of the present invention that a bar of lead salt material, such as lead telluride, has applied along the length thereof a voltage, and propagates an acoustic wave along its length, with the value of the voltage being such that a particular mode of the acoustic wave is amplified within the material.

Figure 2:
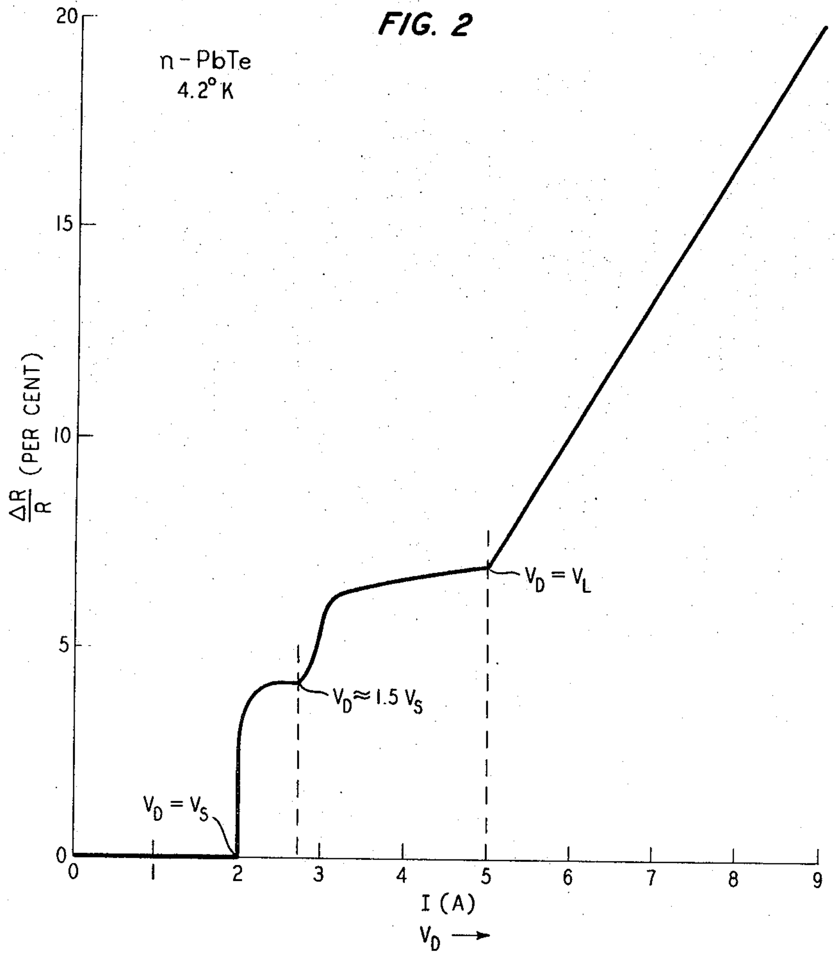

The various objects and features of the present invention will be more readily apparent from the following detailed description, taken in conjunction with the accompanying drawings, in which:

FIG. 1 is a diagrammatic view of an illustrative embodiment of the invention; and FIG. 2 is a graph of a particular characteristic of the amplifier of FIG. 1.

Turning now to FIG. 1, there is shown an acoustic wave amplifier 11 which comprises a bar 12 of lead telluride (PbTe) crystal preferably cut in the (100) direction. Soldered or otherwise affixed to one end of bar 12 is an input transducer assembly 13 comprising a quartz buffer plate 14 and transducer 16. Electrical signals to be amplified are applied from a suitable source 17 to transducer assembly 13 where they are converted to acoustic waves for propagation through member 12. Affixed to the other end of bar 12 is an output transducer assembly 18 comprising a quartz buffer plate 19 and transducer 21 for converting acoustic waves in member 12 into electrical signals and applying them through leads 22, 23 to a suitable load.

A variable voltage source 24 is connected to either end of member 12. As will be apparent hereinafter the voltage from source 24 is necessary for the operation of the amplifier, and also is used to control the amount of gain and type of gain. Amplifier 11, which is a cryogenic device, is contained in a suitable low temperature enclosure 26. Enclosure 26 is shown in dashed outline inasmuch as it may take any one of a number of suitable forms known to workers in the art.

In the operation of the amplifier 11, member 12 is capable of propagating shear acoustic waves or longitudinal acoustic waves or both simultaneously. Assuming that input transducer 13 launches both types onto member 12, the shear wave propagates at a velocity $V_S$ that is somewhat less than the velocity $V_L$ of the longitudinal waves. Application of a voltage from source 24 along the bar produces a carrier, that is, electron drift therealong. The drift velocity $V_D$ initially increases proportionately as the voltage increases, that is to say, the drift current increases ohmically with increasing voltage.

FIG. 2 is a graph of the resistive behavior of member 12 under the influence of an increasing current. The ordinate of the graph is in terms of the change in resistance with the abscissa in terms of current. As can be seen in FIG. 2, member 12 behaves ohmically, that is, no change in resistance as the voltage, and hence the current and drift velocity are increased up to 2 amperes of current. In this range there is no carrier heating to speak of.

In the graph of FIG. 2, at 2 amperes current, there is an abrupt increase in resistance. This marks the onset of stimulated emission of thermal phonons or amplification of an acoustic wave in the case of an input signal which have reached a state of inversion with respect to acoustic phonons of the shear wave. At this point the drift velocity $V_D$ and the shear wave velocity $V_S$ are equal, and the stimulated emission of thermal phonons given up by the carriers to the shear wave amplify the shear wave. The value of current (or voltage) at which the break occurs varies from sample to sample, according to cross section and carrier concentration, hence it is more accurate to define the amplification point as that value of voltage or current where the carriers emit thermal phonons to the shear acoustic wave, thereby amplifying it.

As the voltage from source 24 is increased still further, the change in resistance decreases until a second breaking point occurs at a current value where $V_D$ is approximately 1.5 $V_S$. At this point the second harmonic of the shear acoustic wave commences to be amplified. At this point, the kinetic energy of the electrons is more than twice what it was at $V_D = V_S$, so that electrons can interact with a phonon of energy $h\omega$, where $h$ is Planck's constant and $\omega$ is $2\pi$ times the acoustic wave frequency, to produce a phonon of energy $2h\omega$. This occurs most strongly for high-frequency phonons, where the nonlinearity of interaction is greatest. As a consequence, at this point in the characteristic of member 12, the device functions as an efficient second harmonic generator.

Increasing the voltage and current still further increases the carrier drift velocity $V_D$ until a third pronounced break in the characteristic occurs where the drift velocity $V_D$ equals the velocity $V_L$ of the longitudinal acoustic wave propagating through the material. From this stage on amplification of the longitudinal acoustic wave dominates. As can be seen from FIG. 2, the ratio $\Delta R/R$ increases relatively uniformly with no tendency toward saturation as happens with the shear wave and the second harmonic. As a consequence, extremely high gains are possible in the longitudinal mode.

Because of the extremely high carrier mobility in a lead salt such as PbTe, the acoustic amplifier can be operated continuously. In addition, there are no hot electron effects to reduce the mobility, as in germanium. Furthermore, the magneto-resistance of PbTe and other lead salts is much smaller than it is in materials such as bismuth, which means much less heating for a given velocity than in bismuth. The high carrier concentration and low acoustic wave propagation velocity in PbTe, for example, means extremely high gains at relatively low voltages and at high frequencies is possible. For example, a lead telluride amplifier is able to produce one hundred times the gain achievable with germanium. This means that under ideal conditions, a lead telluride acoustic amplifier can produce gains of there thousand (3000) db/cm. The amplifier of FIG. 1 is a cryogenic device. However, its remarkable characteristic is not particularly temperature sensitive within cryogenic limitations. Thus, extremely high gains have been obtained at 1.8°, 4.2°, and 77° K. This means, of course, that the amplifier may readily be used in systems where the operating temperature is dictated by other factors.

The foregoing discussion was based upon the assumption that both shear waves and longitudinal waves were launched simultaneously onto member 12. Obviously this is not necessary. Either type of wave may be launched to the exclusion of the other where desired. Thus, if the signal is launched in the form of a shear wave and operation is in the region of shear wave amplification, and the output transducer converts the shear mode waves into output signals, any noise existing in the longitudinal mode is not amplified, with a consequent improvement in the noise figure of the amplifier.

While the foregoing discussion was based upon an input to the amplifier, in the absence of an input, thermal shear waves which exist in the material at all times, will be amplified. Thus the amplifier functions as a noise generator.

The foregoing has been intended to illustrate the principles of the present invention. Numerous changes may readily occur to workers in the art without departing from the spirit and scope of the invention.

What is claimed is:

1. Apparatus for amplifying microwave frequency acoustic waves comprising a member of material of the lead salt group, a source of signals to be amplified, means for launching the signals onto said member in the form of acoustic waves, means for producing a carrier movement in said member, said member being characterized by three discrete modes of amplification depending upon the drift velocity of said carriers, said carrier movement producing means being adjustable for operation of said member in one of said modes, and means for converting amplified acoustic waves in said one mode into electrical signals.

2. Apparatus as as claimed in claim 1 wherein the material of said member is lead telluride.

3. Apparatus as claimed in claim 1 wherein said means for launching the signals converts said signals into shear acoustic waves and the means for converting the amplified acoustic waves converts shear acoustic waves into electrical signals.

References Cited

UNITED STATES PATENTS

| | | | |
|---|---|---|---|
| 2,712,638 | 7/1955 | Arenberg | 333—30 |
| 3,173,100 | 3/1965 | White. | |
| 3,234,482 | 2/1966 | Rowen et al. | |

OTHER REFERENCES

"Effect of Impurities on the Electrical Properties of Lead Telluride" by T. L. Koval 'chik et al., Soviet Physics-Technical Physics, vol. 1, No. 11, November 1956, pp. 2337–2339 relied on.

RODNEY D. BENNETT, *Primary Examiner.*

BENJAMIN A. BORCHELT, *Examiner.*

M. F. HUBLER, *Assistant Examiner.*